United States Patent [19]
Takahashi et al.

[11] 3,932,768
[45] Jan. 13, 1976

[54] LIMITING AMPLIFIER

[75] Inventors: Nobuaki Takahashi, Yamato; Masao Kasuga, Sagamihara, both of Japan

[73] Assignee: Victor Company of Japan, Ltd., Japan

[22] Filed: Mar. 12, 1974

[21] Appl. No.: 450,394

[30] Foreign Application Priority Data
Mar. 15, 1973 Japan.............................. 48-29472
Mar. 15, 1973 Japan......................... 48-31171[U]

[52] U.S. Cl. .................. 307/237; 307/264; 330/25; 330/30 D
[51] Int. Cl.² ...................... H03K 5/08; H03G 3/30
[58] Field of Search ........ 307/237, 264; 330/25, 28, 330/30 D, 38 M

[56] References Cited
UNITED STATES PATENTS
3,241,082   3/1966   Van Ligten et al............... 330/25 X
3,721,914   3/1973   Nakamura ......................... 330/25

Primary Examiner—John Zazworsky

[57] ABSTRACT

A limiting amplifier comprises a first differential amplifier having a transistor to which an input signal is applied and a transistor to which a constant voltage is applied. A second differential amplifier amplifies the output of the first differential amplifier. A DC component of the output of the second differential amplifier is applied as a negative feedback to the input side of the first differential amplifier. A limiting circuit is connected between a point which is connected to the output side of the second differential amplifier and a terminal for supplying constant voltage. The resulting differential amplifier is especially well suited for incorporation in a monolithic circuit.

15 Claims, 3 Drawing Figures

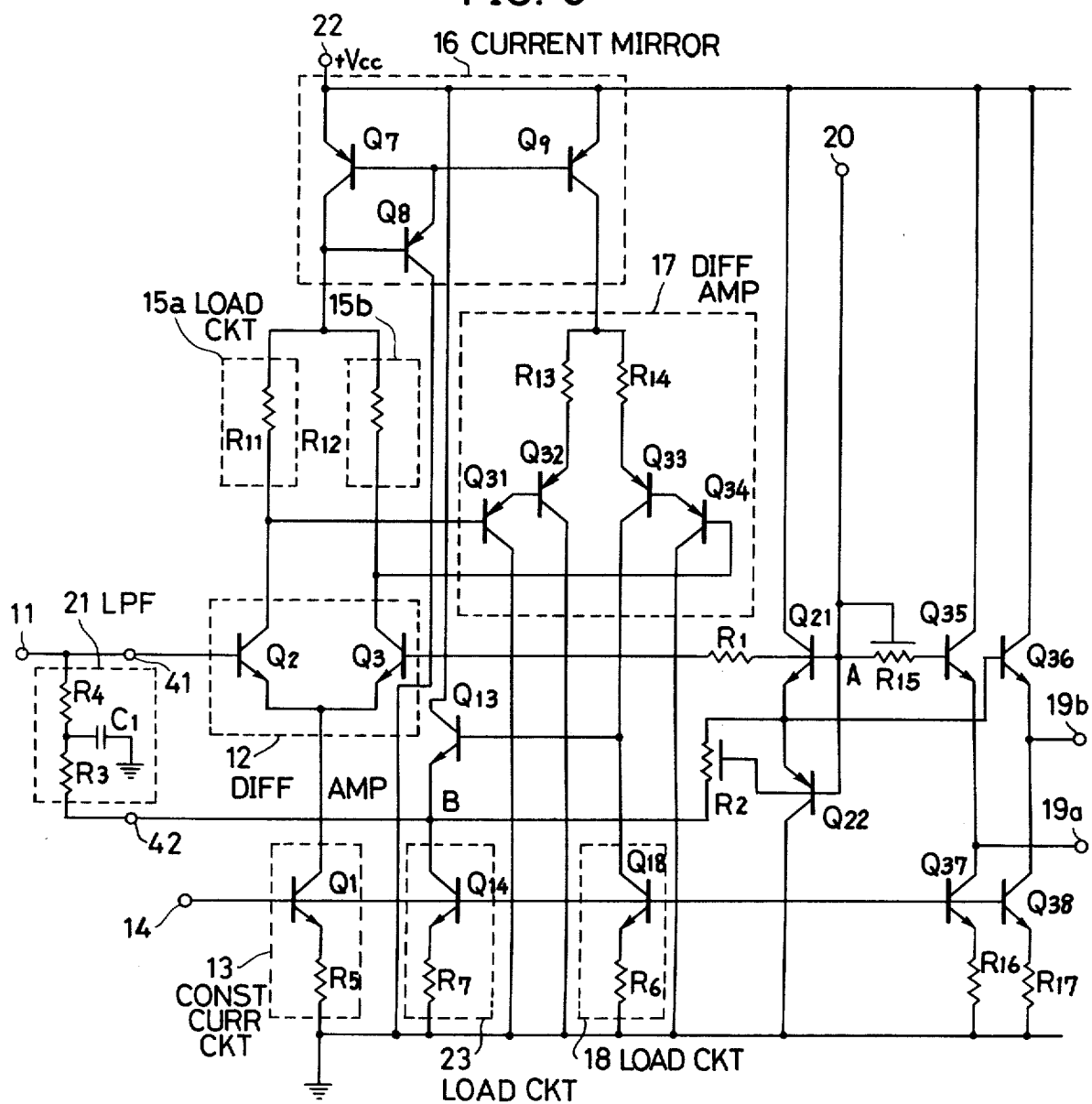

3,932,768

LIMITING AMPLIFIER

BACKGROUND OF THE INVENTION

The present invention relates generally to a limiting amplifier for limiting the amplitude of input signals exceeding predetermined amplitudes. More particularly, the invention relates to a limiting amplifier suitable for incorporation in a monolithic integrated circuit (IC).

In general, various circuits are being widely used as limiting amplifiers for limiting the amplitude and amplifying input signals exceeding respective predetermined amplitudes. When an attempt is made to incorporate these known limiting amplifiers in an IC, it is found that it cannot be done completely. A large number of external circuit must be connected outside of the IC. For this reason, a limiting amplifier of this known type has the disadvantage that it is unadaptable to integrated circuits having a limited number of pins for making the connections to the external circuits.

In accordance with the present invention, a novel circuit is provided for a limiting amplifier, which is highly suitable for incorporation in an integrated circuit. By this circuit arrangement, moreover, it is possible to accomplish a symmetrical amplitude limiting above and below a center level.

SUMMARY OF THE INVENTION

It is a general object of the present invention to provide a novel and useful limiting amplifier.

A specific object of the invention is to provide a limiting amplifier particularly well suitable for incorporating in a monolithic integrated circuit (IC). The limiting amplifier of this invention comprises only circuit elements such as transistors and resistors. With the sole exception of a low-pass filter for negative feedback, the elements are readily incorporated in an IC. In this case, only the low-pass filter is connected outside of the IC.

Another object of the invention is to provide a limiting amplifier which is capable of amplitude limiting accurately and positively, in a symmetrical manner, above and below a center level without offset of the DC level in the output voltage.

Still another object of the invention is to provide a limiting amplifier wherein a current flowing at the time of amplitude limiting does not influence the other circuits. By the use of the limiting amplifier of the present invention, it is possible to attain an effect which is substantially equivalent to a lowering of the internal resistance of a constant-voltage power supply. Voltage fluctuation does not occur at the output point at the time of amplitude limiting. Furthermore, it is possible to incorporate this limiting amplifier effectively within an IC, having a limit to the number of pins, without the necessity of placing a terminal of the constant-voltage power supply outside of the IC chip.

Other objects and further features of the invention will be apparent from the following detailed description with respect to preferred embodiments of the invention when read in conjunction with the accompanying drawings.

BRIEF DESCRIPTION OF THE DRAWINGS

In the drawings:

FIG. 3 is a circuit diagram showing the essential circuit organization of another embodiment of the limiting amplifier according to the invention.

DETAILED DESCRIPTION

Figure 1:
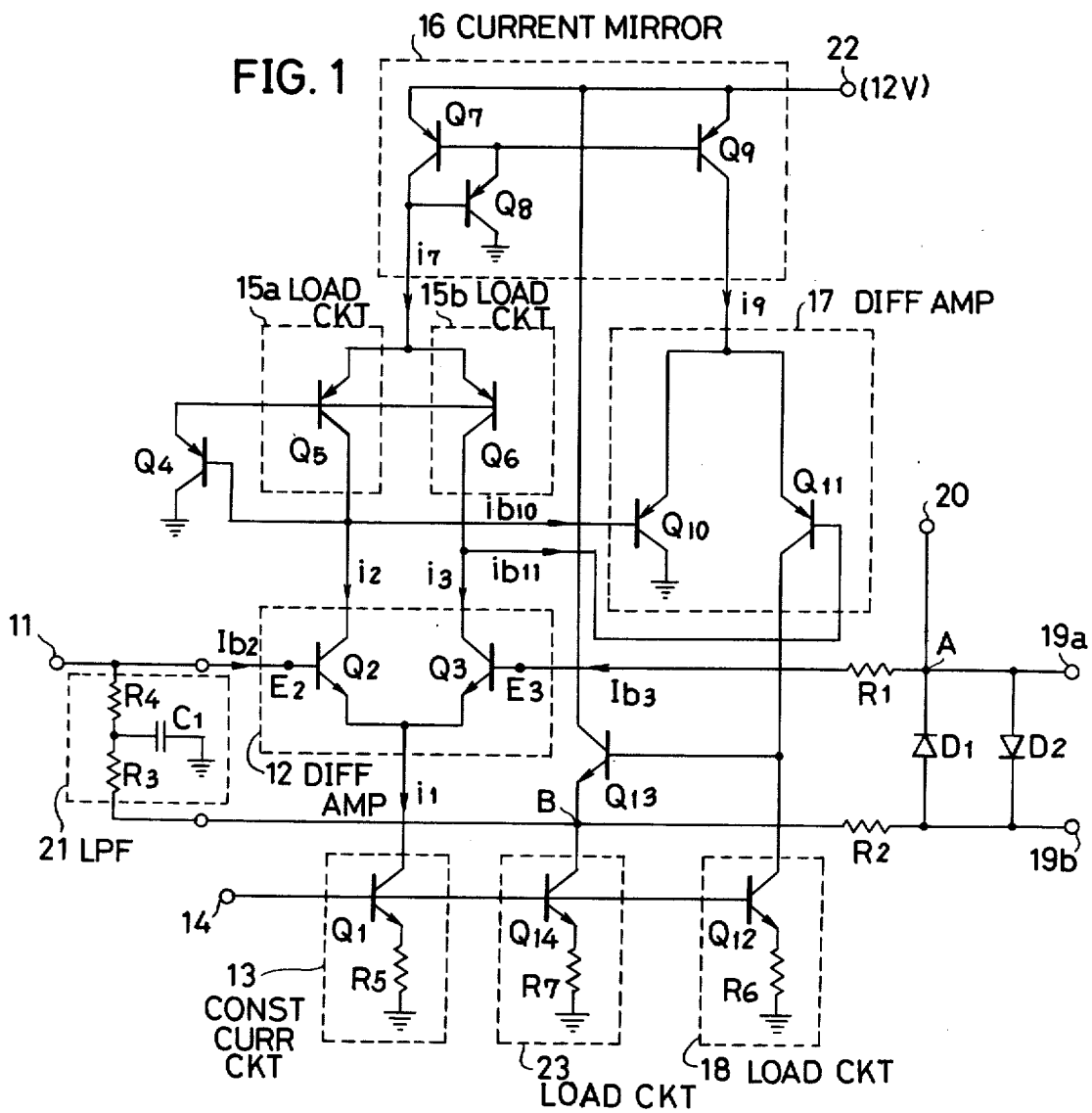
FIG. 1 is a circuit diagram showing the essential circuit organization of one embodiment of a limiting amplifier according to the present invention.

In one embodiment, as illustrated in FIG. 1, an input signal is introduced to the limiting amplifier through an input terminal 11 and is applied to the base of a transistor Q2 of a first differential amplifier 12, comprising the transistor Q2 and a transistor Q3. The emitters of these transistors Q2 and Q3 are connected together at a junction point. A constant-current circuit 13 comprising a transistor Q1 and a resistor R5 is connected between ground and the junction point. The base of the transistor Q1 is connected to a bias power supply terminal 14, on which a voltage of approximately 1 volt is impressed.

The collectors of the transistors Q2 and Q3 of the above mentioned differential amplifier 12 are connected to load circuits 15a and 15b, respectively. These loads comprise transistors Q5 and Q6, the emitters of which are connected to the collector of a transistor Q7 and to the base of a transistor Q8. Transistors Q7, Q8 and Q9 form a current-mirror circuit 16. A transistor Q4 is provided to impart a bias to the transistors Q5 and Q6. The emitter of this transistor Q4 is connected to the bases of the transistors Q5 and Q6. The base and collector of the transistor Q4 are connected respectively to the collector of the transistor Q5 and ground (earth).

The bases of the transistors Q7 and Q9 of the above mentioned current mirror circuit 16 are connected together. The emitters thereof are connected commonly to a terminal 22 on which a voltage of 12V is impressed, the outputs being respectively led out of the collectors thereof. The base and emitter of the transistor Q8 are connected respectively to the collector of the transistor Q7 and to the bases of the transistors Q7 and Q9, while the collector of the transistor Q8 is grounded. By this connection arrangement, the values of the collector currents $i7$ and $i9$ of the transistors are maintained constant.

The collectors of the transistors Q2 and Q3 of the first differential amplifier 12 are connected respectively to the bases of transistors Q10 and Q11, which together form a second differential amplifier 17. The emitters of these transistors Q10 and Q11 are connected commonly to the collector of the transistor Q9 of the above mentioned current mirror circuit 16. Furthermore, the collector of the transistor Q10 is grounded, while the collector of the transistor Q11 is connected to a load circuit 18 and to the base of a transistor Q13.

The load 18 comprises transistor Q12 and a resistor R6 connected from its emitter to ground. The transistor Q13 functions to lower the output impedance of the second differential amplifier 17. The collector of this transistor Q13 is connected to the terminal 22, while its emitter is connected to the collector of a transistor Q14, which together with a resistor R7 constitutes a load circuit 23. Transistor Q13 functions as an emitter-follower arrangement. The bases of the transistors Q1, Q12, and Q14 are connected commonly to the above mentioned bias power supply terminal 14.

The emitter of the transistor Q13 is connected through a resistor R2 to an output terminal 19b and, at the same time, through a low-pass filter 21 comprising resistors R3 and R4 and a capacitor C1, to the base of the transistor Q2 of the first differential amplifier 12, in a manner to effect negative feedback.

If circuits other than this low-pass filter 21 are incorporated together to form an integrated circuit (IC), this low-pass filter is not included in the IC, but is connected as an outside circuit. The resistors R3 and R4 impart a bias to the transistor Q2. The decoupling capacitor C1 causes only a direct-current signal to be applied as this bias.

Between output terminals 19a and 19b, parallel connected diodes D1 and D2 are poled in mutually opposite directions. The output terminal 19a is connected to a terminal 20 which is supplied with approximately 4 volts from a constant-voltage power supply. The terminal 20 is connected by way of a resistor R1 to the base of transistor Q3 of the first differential amplifier 12, whereby a constant bias is applied to the transistor Q3.

The limiting amplifier of the above described circuit arrangement, according to the invention, operates as described below.

An input signal is introduced through the input terminal 11 and applied to the base of the transistor Q2 of the first differential amplifier 12. The difference amplifier 12 amplifies the difference between this input signal and the constant voltage of a constant level applied from the terminal 20 through the resistor R1 to the base of the transistor Q3. The amplified difference is applied to the bases of the transistors Q10 and Q11 of the second differential amplifier 17.

The resulting signal which has been further amplified by the differential amplifier 17 is led out from the collector of the transistor Q11 through the emitter-follower transistor Q13. An output from the emitter of the transistor Q13 is applied through the resistor R2 and amplitude limited by the diodes D1 and D2. Signals which have been so limited do not rise above levels above and below first and second predetermined levels, respectively. The limited signals are led out of the output terminals 19a and 19b.

On one hand, the potential variation of the output point B of the emitter of the transistor Q13 is applied by way of the low-pass filter 21 as a 100-percent DC negative feedback to the base of the transistor Q2 of the first differential amplifier 12. Furthermore, the potential variation of the point B is opposite to the variation of the base potential of the transistor Q2. Accordingly, when viewed under normal stabilized steady state conditions, the DC potentials E2 and E3 become equal at the bases of the transistors Q2 and Q3.

When the base potential of the transistor Q2 of the first differential amplifier 12 rises, the collector potential of the transistor Q11 of the second differential amplifier 17 decreases, whereby the emitter potential of the transistor Q13 decreases. On the other hand, when the base potential of the transistor Q2 decreases, the collector potential of the transistor Q11 rises, whereby the emitter potential of the transistor Q13 rises.

Since the emitter potential of the transistor Q13 is impressed by way of the low-pass filter 21 on the base of the transistor Q2, a DC negative feedback is applied. Accordingly, a balance is attained to hold the potential of point B equal to the potential of the constant-voltage power supply terminal 20. The bias of the transistor Q2 is maintained constant.

Particularly, in the case where the circuit is in the form of an IC, the current amplification factors Hfe of the transistors Q2 and Q3 can be made substantially equal. Since the emitter DC currents of these transistors Q2 and Q3 are also equal, the very small DC currents $Ib2$ and $Ib3$ flowing through their respective bases are also equal. Accordingly, when the values of the resistors R1, R3, and R4 are so selected that the relationship $R1 = R3 + R4$ is satisfied. The potential DC (which is equal to $E3 + (R1 \times Ib3)$, where $Ib3$ is the base DC current of the transistor Q3) of point A becomes equal to the DC potential (which is equal to $E2 + (R3 + R4) \times Ib2$, where $Ib2$ is the base DC current of the transistor Q2) of point B.

For this reason, there is no DC potential difference between the terminals of the diodes D1 and D2. Therefore, both of these diodes are cut-off. When the input signal of the terminal 11 is of a very low level, signals of waveform similar to that of this input signal appear at the output terminals 19a and 19b. On the other hand, when the level of the input signal is high, and the positive or negative level of the output signal exceeds the threshold value of the diodes D1 and D2, these diodes conduct and carry out their limiting functions.

The circuit becomes stable when the DC potentials of the points A and B are substantially equal, as described above. An output signal can be obtained with an accurate amplitude limiting of the waveform symmetrically above and below a predetermined level.

In the instant embodiment, the current mirror circuit 16 is used to drive the first and second differential amplifiers 12 and 17 with equal and constant currents. More specifically, when the base currents $ib10$ and $ib11$ of the transistors Q10 and Q11 in the second differential amplifier 17 are very small, the sum of the collector currents $i2$ and $i3$ of the transistors Q2 and Q3 becomes equal to the collector current $i1$ (constant current) of the transistor Q1. Since this sum of the currents $i2$ and $i3$ is substantially equal to the current $i7$ of one of the outputs of the current mirror circuit 16, this current $i7$ becomes equal to the current $i1$.

On one hand, since the two output currents $i7$ and $i9$ of the current mirror 16 are always maintained mutually equal because of the nature of this circuit, the current $i7$ becomes equal to $i9$ and to $i1$. Therefore, the differential amplifiers 12 and 17 are both driven by equal, constant currents.

In the circuit of the present invention as described above, transistors and resistors make up the circuits such as: the first and second differential amplifiers 12 and 17, the load circuits 15a, 15b, 18, and 23, the constant-current circuit 13, the current mirror 16, the bias circuit Q4, and limiting circuits. Elements such as transistors and resistors can be readily incorporated within an integrated circuit. Therefore, this circuit is highly suitable for incorporation into a monolithic IC, for example. Furthermore, a constant potential is applied from a constant-voltage power supply to one transistor Q3 of the first differential amplifier 12. A 100-percent negative feedback of the DC component of the output of the second differential amplifier 17 is applied to the other transistor Q2. The DC potential (potential at point A) of the constant-voltage power supply is thus held equal to the output DC potential (potential at point B) of the second differential amplifier 17. Therefore, an output is amplitude limited, symmetrically, without offset of DC levels in the output voltages at the terminals 19a and 19b.

An improvement in the circuit above described will now be described. In the preceding embodiment, the internal impedance of the constant-voltage power supply is very small, that is, it is ideally zero. In actual practice, however, the internal impedance of the constant-voltage power source is of an order which is not negligible. Thus, amplitude cannot be ideally limited symmetrically above and below a predetermined level. At the time of amplitude limiting, the voltage $E_A$ at the point A is expressed by $E_A = E - I.r$, where E is the voltage of the constant-voltage power source, r is the internal resistance thereof, and I is the current flowing from the power supply at the time of amplitude limiting. Voltage $E_A$ fluctuates responsive to the amplitude the amplitude limiting current. When voltage fluctuates at the point A, this fluctuation component passes through the resistor R1 and enters the first differential amplifier 12, where it is amplified and appears in the output thereof. As a consequence, the output signal produced by this differential amplifier 12 becomes undesirable.

A solution to this problem is a lowering of the internal impedance of the constant-voltage power supply to a value which is negligible. However, if an emitter follower circuit, for example, is used for lowering this impedance, the resistance value of the resistor connected to the emitter becomes a value which cannot be neglected. Furthermore, it is very difficult in actual practice to hold the above mentioned impedance below a certain value in an IC chip of a specific size. In addition, a capacitor may be connected between the point A and ground in order to remove the voltage fluctuation component of the point A. However, this connection of the capacitor requires an outside constant-voltage power supply and the terminal 20 must be taken out of the IC chip. In an IC, however, there is a limit to the number of pins. It is very difficult to provide a pin for the above described purpose.

Figure 2:
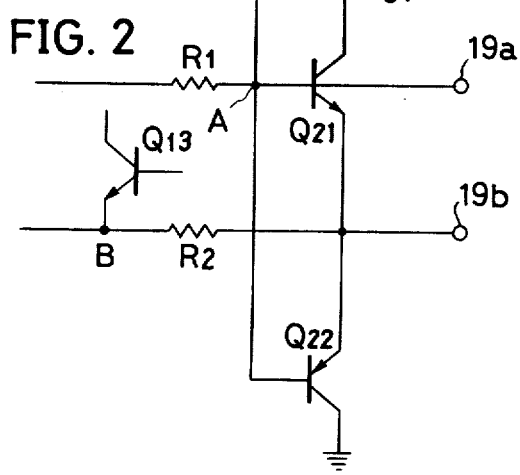
FIG. 2 is a circuit diagram of another embodiment of one part of the circuit illustrated in FIG. 1.

The above described problem is effectively solved in an improved circuit according to the present invention, an essential part of which is illustrated in FIG. 2. This circuit part, shown in FIG. 2, corresponds to that part in the circuit shown in FIG. 1 which includes the resistors R1 and R2, diodes D1 and D2, terminals 19a, 19b, and 20, and the transistor Q13.

This improved circuit has an NPN transistor Q21, the base of which is connected to the above mentioned point A, terminals 19a and 20, and the resistor R1. The collector of this transistor Q21 is connected to a +B power supply terminal 31. The base of a PNP transistor Q22 is connected to the point A, and the collector is grounded. The emitters of these transistors Q21 and Q22 are connected together at a junction point, which is connected to the output terminal 19b.

In the circuit of the above described arrangement, the DC potentials at the points A and B are equal when the amplitude of the input signal is small. Consequently, the transistors Q21 and Q22 are both cut-off. For this reason, signals of wave forms similar to the input signal waveform are obtained from the output terminals 19a and 19b.

When the negative part of an AC input signal is applied to the input terminal (11), this input signal is amplified and phase inverted by the first differential amplifier (12), and a positive AC signal appears at the point B. When the level of this AC signal becomes higher than the voltage $V_{BE}$ ($\approx 0.7$ V) in the forward direction between the base and emitter of the transistor Q22, the transistor Q22 is switched from "OFF" to "ON". The output appearing at the point B is grounded by way of transistor Q22. As a consequence, the amplitude of the output is limited below a specific level, and applied to the output terminals 19a and 19b.

The potential at the point A fluctuates somewhat because of the current flowing through the base of the transistor Q22; however, this base current is 1/Hfe of the emitter current. Therefore, the fluctuation component of this potential is also reduced to 1/Hfe. The stability, with respect to fluctuation, is increased Hfe times.

Similarly, when the positive part of an AC input signal is applied to the input terminal 11, a negative AC signal appears at the point B. When the level of this signal becomes lower than the voltage $V_{BE}$ in the forward direction between the base and emitter of the transistor Q21, the transistor is changed over from OFF to ON. Consequently, a current flows from the terminal 31 through the transistor 21. The potential of the output terminal 19b is maintained at a constant value. As a result, the amplitude of the output is limited above a parts above a specific level and applied to the output terminals 19a and 19b. The base current of the transistor Q21 is 1/Hfe of the emitter current, and the voltage fluctuation at the point A is reduced to 1/Hfe.

In the circuit of the instant embodiment, transistors are used as limiting elements. Their bases are connected to a constant-voltage power supply terminal. For this reason, when the limiting elements assume the ON state, the current flowing through the constant-voltage power supply terminal can be made very small. Accordingly, it is possible to achieve an effect which is substantially equivalent to that in the case where the internal resistance of the constant-voltage power supply is lowered. Hence, the voltage fluctuation component is greatly reduced at the output point, at the time of amplitude limiting. It is possible to obtain an output which does not contain unnecessary components, and which has been amplitude limited accurately and symmetrically above and below predetermined levels. Furthermore, there is no necessity of placing the constant-voltage power source terminal outside of the IC chip. The circuit can be readily incorporated within an IC chip, while employing a small number of pins. Moreover, although the circuit is incorporated in an IC, the current flowing at the time of amplitude limiting has little influence on the other circuits.

A specific embodiment combines the circuit of FIG. 2 with the circuit shown in FIG. 1, which combination can be used as illustrated in FIG. 3. The parts in the circuit shown in FIG. 3 which are the same as corresponding parts in FIGS. 1 and 2 are designated by like reference numerals and will not be described in detail again. Only the points on which the circuit of FIG. 3 differs from the circuits shown in FIGS. 1 and 2 will be described.

The load circuits 15a and 15b comprise resistors R11 and R12. The differential amplifier 17 comprises four transistors Q31 through Q34 and resistors R13 and R14. Transistors Q35 and Q36 constitute a buffer amplifier an emitter follower configuration. To their respective emitters, a transistor Q37 and a resistor R16 and a transistor Q38 and a resistor R17 are connected. The point A is connected by way of a resistor R15 to the base of the transistor Q35, while the point B is connected by way of the resistor R2 to the base of the transistor Q36. The emitters of the transistors Q35 and Q36 are connected to the output terminals 19b and 19a. The low-pass filter 21 is connected, as an outside-connected circuit, to terminals 41 and 42 of the IC.

An example of the constants of the circuit elements of the above described arrangement is, as follows:

Resistors

| | | | |
|---|---|---|---|
| R1 | 10 KΩ | R2 | 15 KΩ |
| R3 | 5 KΩ | R4 | 5 KΩ |
| R5 | 500 Ω | R6 | 1.2KΩ |
| R7 | 360 Ω | | |
| R11 | 4.3KΩ | R12 | 4.3KΩ |
| R13 | 300 Ω | R14 | 300 Ω |
| R15 | 11 KΩ | R16 | 1.5KΩ |
| R17 | 1.5KΩ | | |

Capacitor

| | |
|---|---|
| C1 | 0.01 μF |

While, in the above described embodiment, the bases of the transistors Q21 and Q22 are commonly connected to the constant-voltage power supply terminal 20, the limiting amplifier according to this invention is not so limited. It is also possible to impress, respectively, on the bases of these transistors center voltages which are respectively greater or less, by a predetermined voltage, than the constant voltage.

If the above described circuit in IC form is to be used merely as an amplifier, an output may be led out of the terminal 42.

Further, this invention is not limited to these embodiments but variations and modifications may be made without departing from the scope and spirit of the invention.

What is claimed is:

1. A limiting amplifier comprising: a first differential amplifier means including an input, an output and a pair of transistors therebetween; a circuit point for applying therethrough an input signal to the base of one of said pair of transistors; a circuit point for supplying therethrough a constant voltage to the base of the other of said pair of transistors; a second differential amplifier means including an input and an output, said second amplifier means being connected for amplifying the output of said first differential amplifier; a circuit point for applying as negative feedback a DC output component of said second differential amplifier to the base of said one of said pair of transistors of the first differential amplifier; and a limiting circuit means connected between an output point and the output side of said second differential amplifier and said constant voltage supplying circuit point for producing a limited output from said limiting amplifier.

2. A limiting amplifier as claimed in claim 1 which further comprises a low-pass filter circuit means connected between said circuit point for negative feedback and the input side of said one of the pair of transistors of the first differential amplifier.

3. A limiting amplifier as claimed in claim 1 which further comprises a constant-current circuit means for driving said first differential amplifier with a constant current and a current mirror circuit means for supplying to said second differential amplifier an operating current which is substantially equal to the output current of said constant-current circuit.

4. A limiting amplifier as claimed in claim 1 in which the voltage of said constant-voltage supplying circuit point and the voltage at the output side of said second differential amplifier are substantially equal.

5. A limiting amplifier as claimed in claim 4 in which said limiting circuit comprises a pair of diodes connected in parallel, with polarities of mutually opposite directions.

6. A limiting amplifier as claimed in claim 1 in which said limiting circuit comprises a PNP transistor and an NPN transistor having their emitters connected together, means for supplying different voltages to their collectors, and means for applying specific voltages in accordance with said constant voltage to the bases of said PNP and NPN transistors, and means connected between the bases and emitters of the two transistors for supplying an output signal.

7. A limiting amplifier as claimed in claim 6 in which the bases of the two transistors are connected commonly to said constant-voltage supply point.

8. A limiting amplifier as claimed in claim 1 which is incorporated in an integrated circuit, and in which said circuit point for negative feedback is a terminal for connection of said integrated circuit to an external circuit, a low-pass filter for negative feedback being connected to said terminal.

9. A limiting amplifier comprising:
first differential amplifier means including first and second transistors connected in a differential circuit configuration;
second differential amplifier means including third and fourth transistors, the base electrode of the third transistor being connected directly to the collector electrode of the first transistor, the base electrode of the fourth transistor being directly connected to the collector electrode of the second transistor;
means comprising a fifth transistor connected in an emitter follower circuit configuration, the base electrode of the fifth transistor being connected directly to the collector electrode of the fourth transistor;
an input circuit means for supplying a signal to the base electrode of the first transistor;
means comprising a first power supply terminal for supplying the collector electrodes of the first, second and fifth transistors and the emitter electrodes of the third and fourth transistors respectively;
means comprising a second power supply terminal connected through a first resistor to the base electrode of the second transistor for supplying a bias voltage thereto;
means comprising an output terminal connected through a second resistor to the emitter electrode of said fifth transistor;
limiting circuit means connected to said second power supply terminal and said output terminal for amplitude-limiting signals appearing at the emitter electrode of said fifth transistor;
low-pass filter means connected between said input terminal and the emitter electrode of said fifth transistor for supplying to the base electrode of the first transistor a direct current component of the signal appearing at the emitter electrode of said fifth transistor so that the direct current potential on the emitter electrode of said fifth transistor is substantially equal to the direct current potential on said second power supply terminal whereby a signal appearing at said output terminal becomes a symmetrically amplitude limited signal without offset of direct current level thereof.

10. A limiting amplifier as claimed in claim 9 wherein said low-pass filter means comprises a series branch of third and fourth resistors and a shunt branch including a capacitor connected from the junction point of the third and fourth resistors to ground, a sum of the resistance values of the third and fourth resistors being substantially equal to the resistance value of the first resistor.

11. A limiting amplifier as claimed in claim 9 further comprising a constant-current circuit means connected to the emitter electrodes of the first and second transistors for driving of said first differential amplifier means with a constant-current, and a current mirror circuit means connected to said first power supply terminal for supplying therethrough to said second differential amplifier means a current which is substantially equal to a current passing through said constant-current circuit means.

12. A limiting amplifier as claimed in claim 9 wherein said limiting circuit means comprises a pair of diodes connected in parallel and poled in mutually opposite directions.

13. A limiting amplifier as claimed in claim 9 wherein said limiting circuit means comprises a PNP transistor and an NPN transistor having their emitter electrodes connected to said output terminal, the collector electrode of said NPN transistor being connected to said first power supply terminal, the collector electrode of said PNP transistor being connected to ground, the base electrodes of the PNP transistor and NPN transistor being connected to said second power supply terminal.

14. A limiting amplifier as claimed in claim 9 incorporated into an integrated circuit with said low-pass filter means externally connected thereto, and feedback means connected to the emitter electrode of said fifth transistor, said low-pass filter means being connected between said input terminal and said feedback terminal.

15. A limiting amplifier comprising:
a first differential amplifier means comprising a pair of transistors for producing a differentially amplified output;
means for applying an input signal to the base of one of said pair of transistors;
means for supplying a constant voltage to the base of the other of said pair of transistors;
a second differential amplifier means for amplifying the output of said first differential amplifier and producing a differentially amplified output thereof including a DC output component;
negative feedback means for applying the DC component in the output of said second differential amplifier to the base of said one of said pair of transistors of the first differential amplifier;
output means connected to the output side of said second differential amplifier and for producing an output signal having a limited amplifier; and
a limiting circuit connected between said output means and said constant voltage supplying means.

* * * * *